US011948820B1

(12) United States Patent
Chiu et al.

(10) Patent No.: US 11,948,820 B1
(45) Date of Patent: Apr. 2, 2024

(54) LATCHING GUIDE STRUCTURE (71) Applicant: GUDENG PRECISION INDUSTRIAL CO., LTD., New Taipei (TW)

(72) Inventors: Ming-Chien Chiu, New Taipei (TW); Chih-Ming Lin, New Taipei (TW); Cheng-Han Chou, New Taipei (TW); Po-Ting Lee, New Taipei (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 0 days.

(21) Appl. No.: 18/070,390

(22) Filed: Nov. 28, 2022

(30) Foreign Application Priority Data

Sep. 28, 2022 (TW) .................................. 111136873

(51) Int. Cl.
*H01L 21/673* (2006.01)

(52) U.S. Cl.
CPC .. *H01L 21/67373* (2013.01); *H01L 21/67369* (2013.01); *H01L 21/67386* (2013.01)

(58) Field of Classification Search
CPC ................ H05K 7/1428; H05K 5/0204; H01L 21/67373; H01L 21/67369; H01L 21/67386; H01L 21/6735; H01L 21/6732; H01L 21/67376
USPC .......................................... 206/710–712, 832
See application file for complete search history.

(56) References Cited

U.S. PATENT DOCUMENTS

| 3,820,682 | A | * | 6/1974 | Davella | G02B 23/16 359/511 |
| 4,995,430 | A | * | 2/1991 | Bonora | H01L 21/67373 414/217 |
| 5,957,292 | A | * | 9/1999 | Mikkelsen | H01L 21/67373 414/217 |
| 6,622,883 | B1 | * | 9/2003 | Wu | H01L 21/67373 220/323 |
| 6,902,063 | B2 | * | 6/2005 | Pai | H01L 21/67373 206/832 |
| 7,182,203 | B2 | * | 2/2007 | Burns | E05B 17/0041 220/326 |
| 7,272,984 | B2 | * | 9/2007 | Fan | B60R 11/0241 74/89.17 |
| 7,909,166 | B2 | * | 3/2011 | Lin | H01L 21/67373 220/323 |

(Continued)

*Primary Examiner* — Chun Hoi Cheung
(74) *Attorney, Agent, or Firm* — Cheng-Ju Chiang (57) ABSTRACT

The present invention provides a latching guide structure arranged inside a door of semiconductor carrier. The latching guide structure comprises an upper latching part, a lower latching part, at least one elastic unit and a driver. Moreover, a first guiding portion of the upper latching part is matched with a second guiding portion of the lower latching part, therefore to define the installation space for the at least one elastic unit. On the other hand, the driver simultaneously actuates an upper actuating unit of the first guiding portion and a lower actuating unit of the second guiding portion to linearly move in reverse direction therebetween. The range of the linear motion of the upper actuating unit and the lower actuating unit represents the compression or extension of the at least one elastic unit, determining to control the open/close status of the upper latching part and the lower latching part.

10 Claims, 6 Drawing Sheets

(56) References Cited

U.S. PATENT DOCUMENTS

| | | | |
|---|---|---|---|
| 7,967,269 B2* | 6/2011 | Liu | F16M 13/02 |
| | | | 248/316.4 |
| 7,971,723 B1* | 7/2011 | Chiu | H01L 21/67373 |
| | | | 206/711 |
| 8,235,218 B2* | 8/2012 | Chiu | H01L 21/67376 |
| | | | 206/711 |
| 8,276,758 B2* | 10/2012 | Lin | H01L 21/67373 |
| | | | 220/323 |
| 8,403,374 B2* | 3/2013 | Shimizu | E05C 9/04 |
| | | | 292/141 |
| 8,567,737 B2* | 10/2013 | Chen | H04B 1/3877 |
| | | | 379/454 |
| 8,727,192 B2* | 5/2014 | Lai | B62J 50/225 |
| | | | 248/316.4 |
| 8,833,806 B2* | 9/2014 | Wang | H01L 21/67369 |
| | | | 292/159 |
| 8,857,619 B1* | 10/2014 | Yang | H01L 21/67379 |
| | | | 206/710 |
| 9,004,434 B2* | 4/2015 | Kang | H04B 1/3877 |
| | | | 248/316.4 |
| 9,064,917 B2* | 6/2015 | Ku | H01L 21/67373 |
| 9,711,385 B2* | 7/2017 | Ohnuki | H01L 21/67386 |
| 9,797,543 B2* | 10/2017 | Lin | F16M 13/00 |
| 9,955,598 B1* | 4/2018 | Wen | H05K 5/0204 |
| 10,173,812 B2* | 1/2019 | Gregerson | H01L 21/67376 |
| 11,398,395 B2* | 7/2022 | Smith | H01L 21/67373 |
| 2006/0283771 A1* | 12/2006 | Park | H01L 21/67373 |
| | | | 206/832 |
| 2008/0295412 A1* | 12/2008 | Hsiao | H01L 21/67376 |
| | | | 49/475.1 |
| 2013/0277520 A1* | 10/2013 | Funk | G06F 1/1626 |
| | | | 248/274.1 |
| 2015/0101959 A1* | 4/2015 | Chou | H01L 21/67373 |
| | | | 141/7 |
| 2016/0163575 A1* | 6/2016 | Phark | H01L 21/67373 |
| | | | 206/710 |
| 2016/0204011 A1* | 7/2016 | Shigeta | H01L 21/67386 |
| | | | 206/710 |

* cited by examiner

LATCHING GUIDE STRUCTURE

TECHNICAL FIELD

The present invention is related to a latching guide structure, which may be arranged inside the door of semiconductor carrier as a latch.

BACKGROUND

In semiconductor industry, several kinds of thin plate will be used as a material for substrate. Specifically, wafer is a common substrate material. On the other hand, wafer is required to be transferred to different workstations in whole manufacturing process. Therefore, to prevent the collision or contamination during the transferring procedure, the container which carries wafers plays an important role in such manufacturing process. Consider that the wafers must be stored or carried in a carrier which features high cleanliness, good air tightness and antistatic protection, the structural design of the abovementioned carrier may determine the yield of the wafers for manufacturing.

The Front Opening Unified Pod (FOUP) is a popular carrier which is used in the current industry, and so the EUV Pod is, too. When the carrier has been opened or closed, the outside environment may significantly affect to the substrates carried inside per se. Hence, the operational precision and airtightness of the latch design of the door of the semiconductor carrier shall be well considered.

For instance, the latch structure of commercial FOUP is mostly embedded inside the door case, decreasing the mechanical collision of the carried wafers therebetween during the opening or closing of the door. However, the presented technique is still hard to try to solve the problems of wafer vibration or friction, though the prior arts have provided multiple structures of latches of FOUP.

Refer to the abovementioned prior arts, a solution is to configure a limitation unit in the inner side of door. The limitation unit may directly absorb the mechanical force which is created by the operation of door, but fail to consider the problems such as angular deviation, wafer displacement, or misalignment between carriers which are created by carrying the transferring equipment (e.g., robotic arms or Overhead Hoist Transfer).

In light of the latch is a complex and precious structure, any displacement occurred in the semiconductor carrier may cause the angular deviation. When the latch structure cannot be latched preciously, the air tightness may be broken. Therefore, the person having ordinary skill in the art is expected to develop the solutions for the abovementioned problems.

SUMMARY OF INVENTION

To solve the problems mentioned in the prior art, the present invention discloses a latching guide structure, compensating the angular displacement caused by the rotational equipment deviation via controlling linear moving parts and the elastic unit which may automatically turn back to the resting position by itself.

Overall, the present invention provides a latching guide structure which is arranged inside the door of semiconductor carrier. The latching guide structure mentioned in this invention comprises an upper latching part, a lower latching part, at least one elastic unit and a driver. The upper latching part has a first guiding portion, and the first guiding portion comprises an upper actuating unit. On the other hand, the lower latching part has a second guiding portion, and the second guiding portion comprises a lower actuating unit. The position of the second guiding portion is matched with the first guiding portion, defining an installation space via the second guiding portion and the first guiding portion.

Specifically, the at least one elastic unit is configured in the installation space. The driver engages with the upper actuating unit and the lower actuating unit. Thereon, the driver comprises a main driving portion, and a controlling portion connected with the main driving portion. The controlling portion is configured to control the main driving portion, and the controlling portion simultaneously engages with the upper actuating unit and the lower actuating unit for linearly moving in reverse direction between the upper actuating unit and the lower actuating unit. Furthermore, the elastic unit represents a compression level or an extension level which are determined by linear movement between the upper actuating unit and the lower actuating unit, controlling the upper latching part and the lower latching part to be an open status or a close status.

The above summary of the present invention is intended to provide a basic description of the various aspects and features of the present invention. The present invention is not to be construed as being limited to the details of the present invention, and the invention is not intended to limit the scope of the present invention.

DETAILED DESCRIPTION OF THE INVENTION

In order to understand the technical features and practical efficacy of the present invention and to implement it in accordance with the contents of the specification, hereinafter, preferred embodiments of the present invention will be described in detail with reference to the accompanying drawings.

Figure 6:
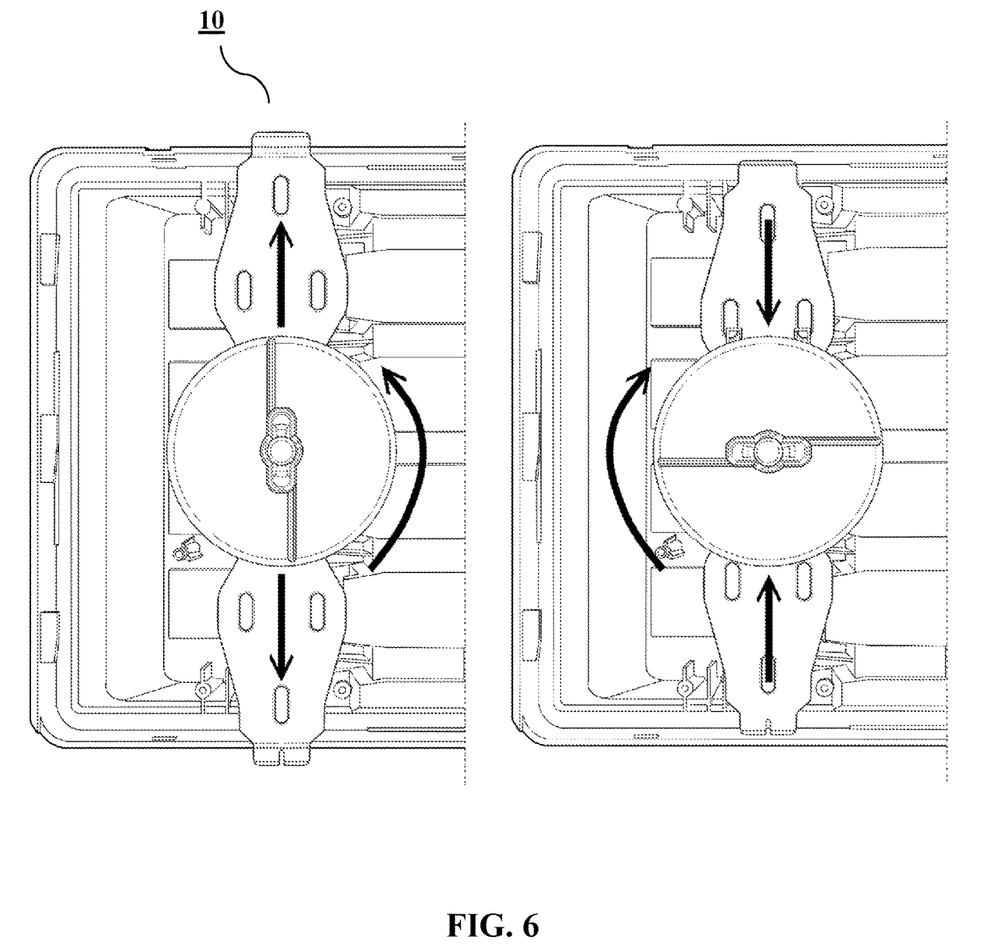
FIG. 6 is the schematic diagram of open status and close status of the latching guide structure which is installed inside the door of semiconductor carrier.

The latching guide structure 10 of the present invention is a latch structure which is installed or arranged inside the door of the semiconductor carrier (please refer to FIG. 6 firstly). The "semiconductor carrier" mentioned herein may be the wafer carriers such as cassette, FOUP, or FOSB . . . etc. In other words, the containers or carriers which may store the wafer shall be read on the scope of the present invention. Moreover, the present invention can be reasonably implemented in the semiconductor containers which needs door latch such as the EUV Pod, the present invention is not limited thereto.

Figure 1:
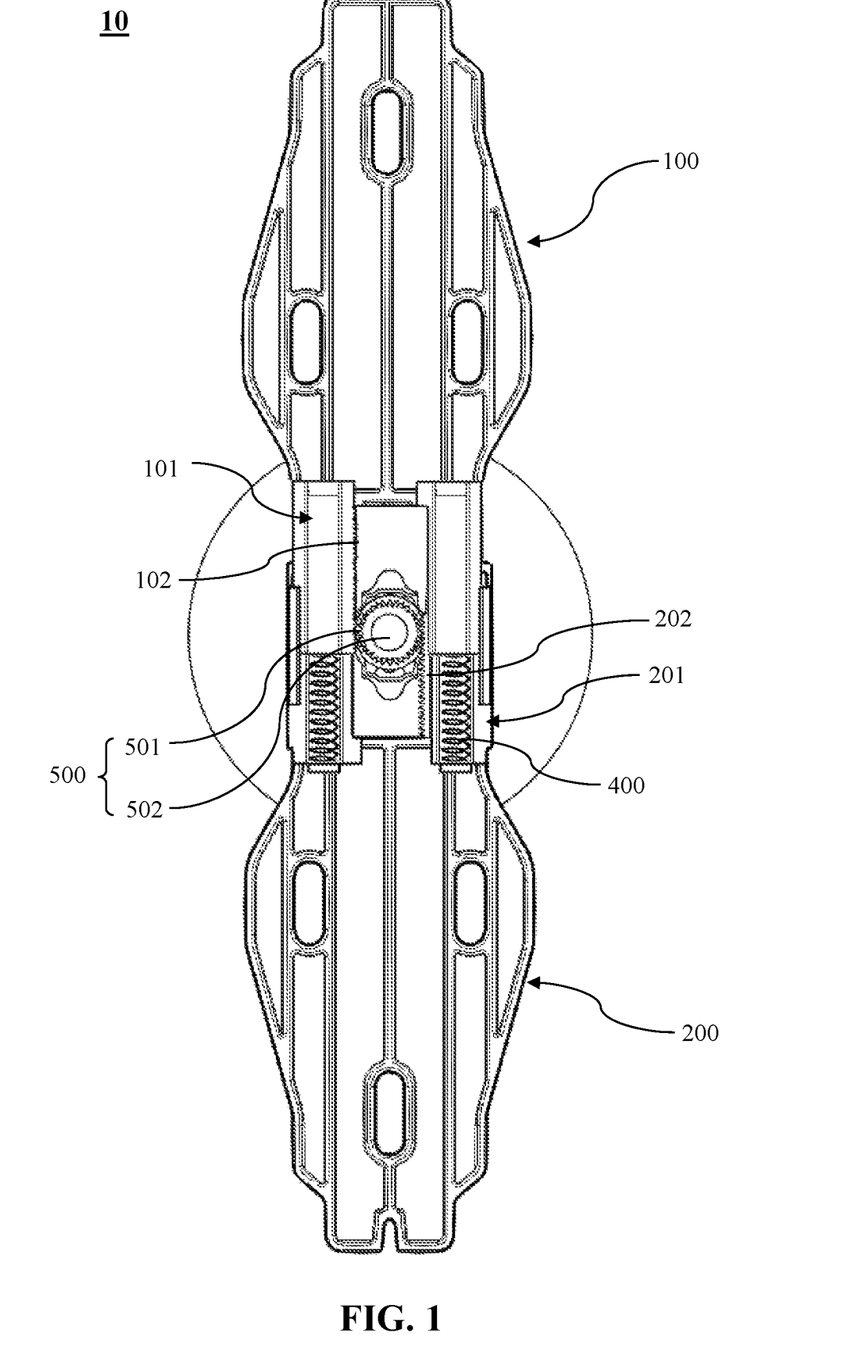
FIG. 1 is the schematic diagram of the structure of the present invention.
Figure 2:
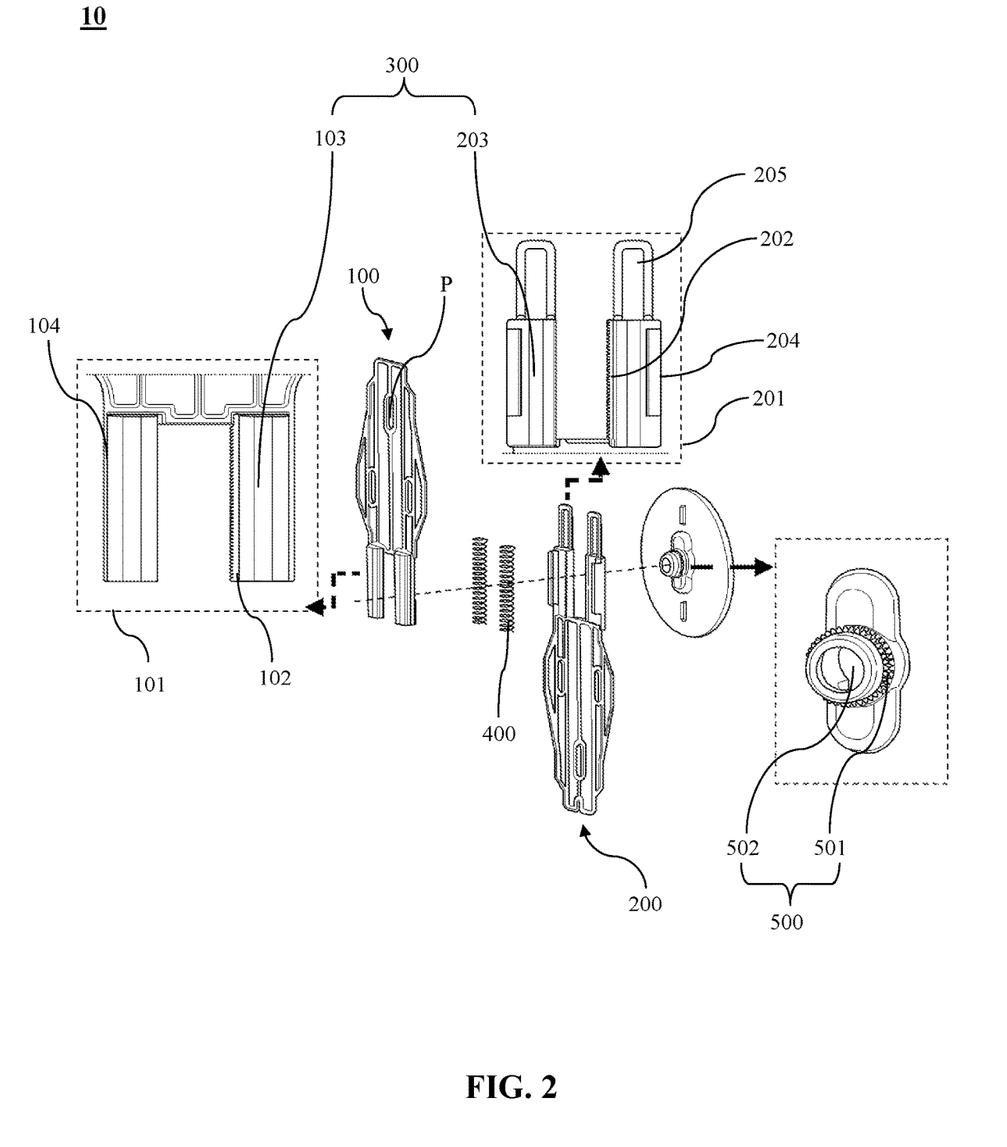
FIG. 2 is the exploded schematic diagram of FIG. 1.
Figure 3:
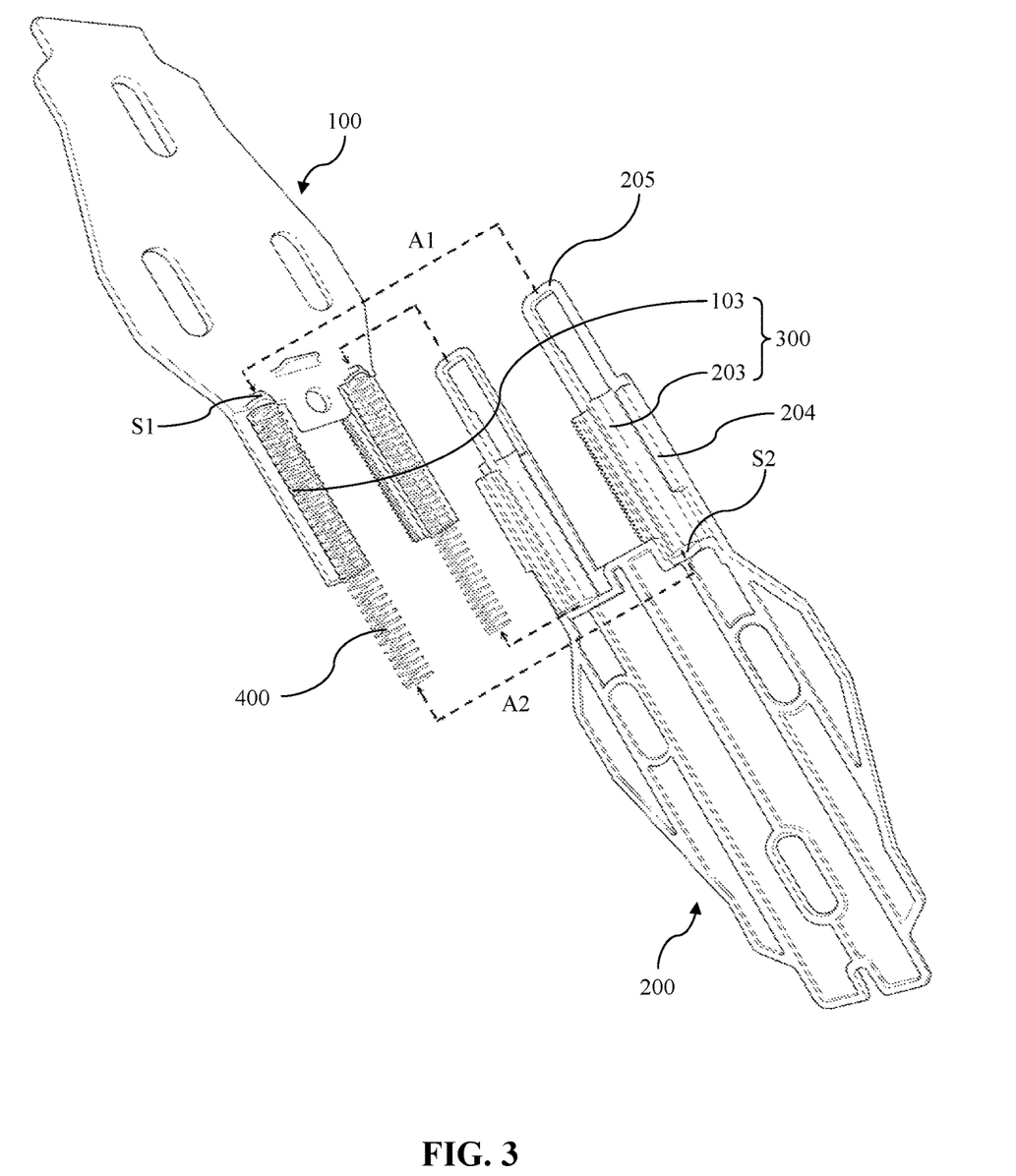
FIG. 3 is the exploded view between the upper latching part and the lower latching part of the present invention from different perspective.
Figure 4:
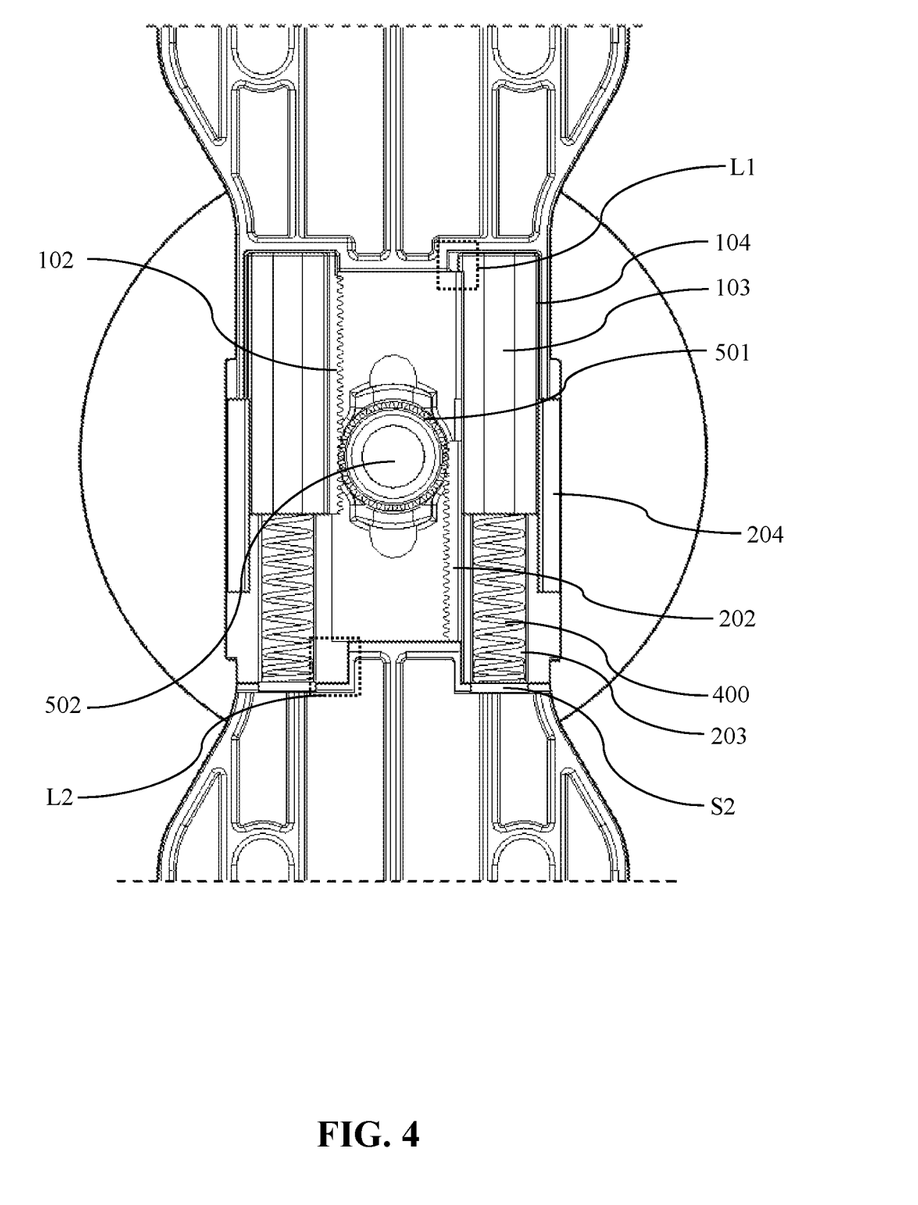
FIG. 4 is the drawing of partial enlargement of the present invention.

Please refer to FIG. 1, FIG. 2, FIG. 3 and FIG. 4 simultaneously. FIG. 1 is the schematic diagram of the structure of the present invention. FIG. 2 is the exploded schematic diagram of FIG. 1. FIG. 3 is the exploded view between the upper latching part and the lower latching part of the present invention from different perspective. FIG. 4 is the drawing of partial enlargement of the present invention. In this embodiment, the latching guide structure 10 comprises upper latching part 100, lower latching part 200, at least one elastic unit 400 and driver 500. The upper latching part 100 and the lower latching part 200 is preferably designed as a flat tongue shape. The upper latching part 100 and lower latching part 200 is controlled by the actuation of driver 500, thus to switch the open status or close status of the door of semiconductor carrier. In the embodiment of FIG. 2, the upper latching part 100 and the lower latching part 200 may further have at least one elongated slot P. The afore-mentioned elongated slot P reduces the weight of upper latching part 100 and lower latching part 200.

Thereby, the upper latching part 100 has first guiding portion 101. The first guiding portion 101 herein comprises upper actuating unit 102, first holding portion 103 and first leading portion 104. The first holding portion 103 is located between the upper actuating unit 102 and first leading portion 104. In such embodiment, the upper latching part 100 is designed to comprise two symmetric first guiding portions 101, and each first guiding portion 101 comprises a first holding portion 103 and a first leading portion 104 thereon. The first leading portion 104 is configured on two outer sides of the first guiding portion 101. In other words, the first leading portion 104 is distal from the location where the driver 500 is configured. Please notice that the upper actuating unit 102 is just configured on inner side of one of the first guiding portion 101. It means that the upper actuating unit 102 is more approaching to the configuration location of driver 500.

The lower latching part 200 has second guiding portion 201. The upper latching part 100 is designed for matching with the lower latching part 200. Moreover, the second guiding portion 201 is configured to match the location of the first guiding portion 101. The second guiding portion 201 comprises lower actuating unit 202, second holding portion 203 and second leading portion 204. The second holding portion 203 is located between the lower actuating unit 202 and the second leading portion 204. In this embodiment, the lower latching part 200 is designed to comprise two symmetric second guiding portion 201, and each second guiding portion 201 comprises second holding portion 203 and second leading portion 204. On the other hand, the second leading portions 204 are configured on outer sides of two second guiding portion 201 such as that the second leading portion 204 is distal from the location of the configuration of driver 500. The lower actuating unit 202 is only configured on the inner side of one of the second guiding portion 201, as regard as the location where is approaching to the driver 500 of lower actuating unit 202.

This embodiment further illustrates the connection between the upper latching part 100 and the lower latching part 200. The first leading portion 104 and second leading portion 204 are matched to be connectable structure such as groove or rail which may engage and move linearly. The present invention does not limit the structure design of first leading portion 104 and second leading portion 204, any structure may be matched, engaged and linearly moved shall be read on the scope of the present invention. When the first leading portion 104 has been connected with the second leading portion 204, the first guiding portion 101 will matches with the location of the second guiding portion 201. Furthermore, first holding portion 103 of the first guiding portion 101 and the second holding portion 203 of the second guiding portion 201 define an installation space 300.

In this embodiment, the installation space 300 holds the elastic unit 400. The upper actuating unit 102 is configured in a diagonal position to the lower actuating unit 202. The driver 500 engages with the upper actuating unit 102 and lower actuating unit 202. The driver 500 comprises main driving portion 501 and controlling portion 502. The main driving portion 501 mainly engages with the upper actuating unit 102 and the lower actuating unit 202, and the controlling portion 502 is used for controlling the actuation of the main driving portion 501.

In instant embodiment, the main driving portion 501 is preferred to be gear, and the upper actuating unit 102 and lower actuating unit 202 are racks. The gear and racks may engage with each other. The controlling portion 502 controls the main driving portion 501 to actuates the linear motion in reverse direction between the upper actuating unit 102 related to the lower actuating unit 202 simultaneously. At the same time, the elastic unit 400 represents the compression or extension level corresponding to linear motion in reverse direction between the upper actuating unit 102 related to the lower actuating unit 202, therefore to control the open status or close status of the upper latching part 100 and the lower latching part 200. The detailed actuations therebetween will be carefully explained thereinafter.

Regarding to the structure design of the above-mentioned first guiding portion 101 and second guiding portion 201, the present invention is structurally stable for installing elastic unit 400 and driver 500 therebetween. The first guiding portion 101 has first stopper S1, and the second guiding portion 201 has second stopper S2. The first stopper S1 and second stopper S2 are located and configured on two ends of installation space 300. Hence, two ends of the elastic unit 400 may retain the first stopper S1 and second stopper S2 individually (As shown as the arrows A1 and A2 illustrated in FIG. 3).

The second guiding portion 201 has a positioning slot 205. The location of positioning slot 205 is distal from the second stopper S2. The structure of the positioning slot 205 may be designed to be an elongated slot, which may match and engage with the first stopper S1. The first stopper S1 is preferably to be a T shape, thus to increase the firmness of the first stopper S1. The design of the engagement and linear movable relationships between the first leading portion 104 the second leading portion 204 proves the firmness of elastic unit 400 hold by the installation space 300. The engagement between the positioning slot 205 of the second guiding portion 201 and the first stopper S1 of first guiding portion 101 makes the driver 500 be located between the two symmetric first guiding portions 101 and between two symmetric second guiding portions 201. Therefore, the connection between the upper latching part 100 and the lower latching part 200 become stable. Specifically, the elastic unit 400 may be spring, or the elastic unit 400 may be other materials, components or combinations which may automatically return to resting position by itself. The present invention is not limited thereto.

Figure 5:
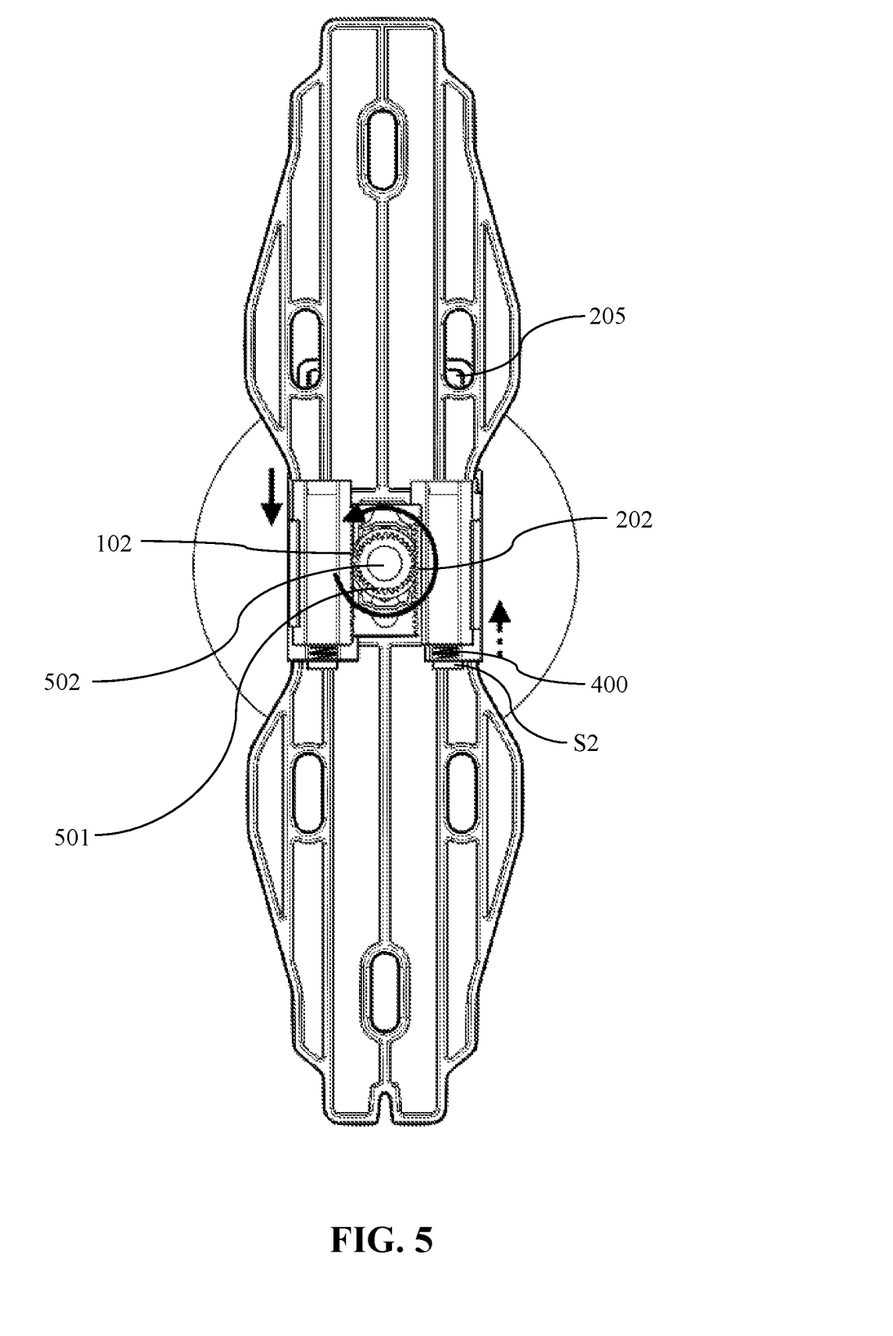
FIG. 5 is the schematic diagram of unlocking of the present invention.

For understanding the above-mentioned structure and connections of the present invention, the foregoing description may illustrate the operating way of the present embodiment. Please refer to FIG. 4, FIG. 5 and FIG. 6 simultaneously. FIG. 5 is the schematic diagram of unlocking of the present invention. FIG. 6 is the schematic diagram of open status and close status of the latching guide structure which is installed inside the door of semiconductor carrier. The latching guide structure 10 is arranged inside the door of semiconductor carrier (not shown). The door of semiconductor carrier has keyholes (not shown). When the upper latching part 100 and the lower latching part 200 extends to the outer place and enters the keyhole configured in the carrier case, the door of semiconductor carrier and the carrier case is locked (close status). However, when the upper latching part 100 and lower latching part 200 retreat inward and be distal from the keyhole, the door of semiconductor carrier and carrier case are unlocked (open status), and the door of semiconductor carrier may be removed from the carrier case.

The controlling portion 502 of driver 500 is a keyhole structure. The key maybe used for inserting the keyhole, therefore to control the actuation of the main driving portion 501. The main driving portion 501 is gear, and the upper actuating unit 102 and lower actuating unit 202 are racks. The gear engages with the racks. When the gear is unidirectionally rotating, the rack of the upper actuating unit 102 and the rack of the lower actuating unit 202 linearly move in reverse direction As described above, when the close status between the door of semiconductor carrier and the carrier case has been unlocked and be open status, the controlling portion 502 rotates 90° clockwise, and the main driving portion 501 simultaneously actuates the upper actuating unit 102 and the lower actuating unit 202 move in reverse direction linearly, making the upper latching part 100 and the lower latching part 200 retreat inward and be distal from the keyhole of carrier case. Specifically, the rack of upper actuating unit 102 and the rack of the lower actuating unit 202 are originally located in diagonal position. However, gear as the main driving portion 501 rotates and engages with the afore-mentioned racks, the racks will start to linearly move. Therefore, the rack of upper actuating unit 102 and the rack of lower actuating unit 202 are aligned horizontally. At the same time, the elastic unit 400 is compressed, and the door of semiconductor carrier and the carrier case form the open status.

The elastic unit 400 configured inside the installation space 300. The spring as known as the elastic unit 400 will be compressed, because the first stopper S1 of the first guiding portion 101 and the second stopper S2 of the second guiding portion 201 are getting closer to each other.

For increasing the displacement space of upper actuating unit 102 and lower actuating unit 202, the first guiding portion 101 of the present invention comprises first leading spacer L1, providing the linear displacement space of lower actuating unit 202. On the other hand, the second guiding portion 201 comprises a second leading spacer L2, providing the linear displacement space of upper actuating unit 102. The first leading spacer L1 and second leading spacer L2 are configured in diagonal position. The first leading spacer L1 and the second leading spacer L2 are preferably to be designed as L shape, however the present invention do not limit the design of the leading spacer.

Furthermore, when the door of semiconductor carrier and the carrier case is operated to form lock status (close status), the controlling portion 502 rotates 90° counterclockwise, and the main driving portion 501 actuates the upper actuating unit 102 and the lower actuating unit 202 move in reverse direction linearly. Therefore, the upper latching part 100 and the lower latching part 200 extend outward and enter the keyhole. In fact, the horizontal aligned racks of upper actuating unit 102 and lower actuating unit 202 will be moved while the engaged gear of main driving portion 501 is rotating. The racks of upper actuating unit 102 and lower actuating unit 202 will be distal from each other and forming the diagonal configuration therebetween. The elastic unit 400 will be extended, and the door of semiconductor carrier and the carrier case form the close status.

The elastic unit 400 turns back to the resting position per se, because the compression created form the first stopper S1 of first guiding portion 101 and the second stopper S2 of second guiding portion 201 has been decreased via the distal displacement therebetween. In addition, at least one part of the first holding portion 103 and at least one part of the second holding portion 203 cover each other. When the upper latching part 100 and lower latching part 200 represent the close status, the elastic unit 400 is exposed to uncovered part of the installation space 300. The elastic unit 400 of the present embodiment may absorb the mechanical force between the upper latching part 100 and lower latching part 200 during sliding per se, and further decrease the friction therebetween, elongating the service life of the latching guide structure 10.

To sum up, no matter it forms the close status or open status of the latching guide structure 10, the relative linear displacement between the upper latching part 100 and lower latching part 200 are controlled well by the upper actuating unit 102, lower actuating unit 202 and main driving portion 501 in certain range. Therefore, the angular deviation crated by the rotation of equipment may be perfectly solved. In other words, the engagement between the gear (main driving portion 501) and racks (upper actuating unit 102 & lower actuating unit 202) makes the present embodiment be able to design certain displacement therein. Moreover, the elastic unit 400 may automatically turns back to the resting position, it helps to solve the problem which is caused by the angular displacement of the equipment difference. Hence, the embodiment of the present invention significantly increases the operational precision of latching guide structure 10.

The preferable embodiments of the present invention mentioned above are neither limited to any single aspect nor embodiment thereof, nor to any combinations and/or permutations of such aspects and/or embodiments. For the sake of brevity, many of those permutations and combinations will not be discussed separately herein.

What the claim is:

1. A latching guide structure which is arranged in a door of semiconductor carrier, wherein the latching guide structure comprises:
    an upper latching part, having a first guiding portion, and the first guiding portion comprises an upper actuating unit;
    a lower latching part, having a second guiding portion, and the second guiding portion comprises a lower actuating unit;
    wherein the second guiding portion is configured to match a location of the first guiding portion, and the second guiding portion and the first guiding portion define an installation space;
    at least one elastic unit, configured inside the installation space; and
    a driver, engaged with the upper actuating unit and the lower actuating unit;
    wherein the driver comprises a main driving portion and controlling portion which is connected with the main driving portion;
    wherein the controlling portion is configured to control the main driving portion, the controlling portion simultaneously engages with the upper actuating unit and the lower actuating unit for linearly moving in reverse direction between the upper actuating unit and the lower actuating unit;

wherein the elastic unit represents a compression level or an extension level which are determined by linear movement between the upper actuating unit and the lower actuating unit, controlling the upper latching part and the lower latching part to be an open status or a close status.

2. The latching guide structure as claimed in claim 1, wherein the first guiding portion has a first stopper, and the second guiding portion has a second stopper; wherein the first stopper and the second stopper are configured on two ends of the installation space respectively, and two ends of the at least one elastic unit retains the first stopper and the second stopper respectively.

3. The latching guide structure as claimed in claim 2, wherein the second guiding portion has a positioning slot, and the positioning slot is fixed and connected with the first stopper.

4. The latching guide structure as claimed in claim 1, wherein the lower actuating unit is configured in a diagonal position to the upper actuating unit.

5. The latching guide structure as claimed in claim 1, wherein the first guiding portion further comprises a first holding portion and a first leading portion, and the first leading portion and the upper actuating unit are configured on two sides of the first holding portion;

wherein the second guiding portion further comprises a second holding portion and a second leading portion, and the second leading portion and the lower actuating unit are configured on two sides of the second holding portion;

wherein the first holding portion and the second holding portion define the installation space, and the installation space holds the at least one elastic unit;

wherein the first leading portion and the second leading portion are matched and linearly move in reverse direction.

6. The latching guide structure as claimed in claim 5, wherein at least one part of the first holding portion is covered with at least one part of the second holding portion; when the upper latching part and the lower latching part represent the close status, at least one part of the at least one elastic unit is exposed to uncovered part of the installation space.

7. The latching guide structure as claimed in claim 1, wherein the first guiding portion further comprises a first leading spacer, providing linear movement space for the lower actuating unit; wherein the second guiding portion further comprises a second leading spacer, providing linear movement space for the upper actuating unit.

8. The latching guide structure as claimed in claim 1, wherein the main driving portion is gear.

9. The latching guide structure as claimed in claim 8, wherein the upper actuating unit and the lower actuating unit are rack, and the gear engages with the racks; and when the gear is unidirectionally rotating, the rack of the upper actuating unit and the rack of the lower actuating unit linearly move in reverse direction.

10. The latching guide structure as claimed in claim 1, wherein the at least one elastic unit is spring.

* * * * *